(12) United States Patent
Kwon et al.

(10) Patent No.: US 7,601,614 B2
(45) Date of Patent: Oct. 13, 2009

(54) MANUFACTURING METHOD OF SILICON ON INSULATOR WAFER

(75) Inventors: Sung Ku Kwon, Daejeon (KR); Young Kyun Cho, Jeonrabuk-do (KR); Jong Dae Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 209 days.

(21) Appl. No.: 11/213,056

(22) Filed: Aug. 26, 2005

(65) Prior Publication Data
US 2006/0128116 A1 Jun. 15, 2006

(30) Foreign Application Priority Data
Dec. 14, 2004 (KR) .................. 10-2004-0105774
May 10, 2005 (KR) .................. 10-2005-0038732

(51) Int. Cl.
*H01L 21/30* (2006.01)
(52) U.S. Cl. ................. 438/458; 257/E21.568
(58) Field of Classification Search ............ 257/354, 257/E21.563, E21.568; 428/425.6; 438/977, 438/455–459
See application file for complete search history.

(56) References Cited

U.S. PATENT DOCUMENTS

| | | | |
|---|---|---|---|
| 6,211,041 B1 | 4/2001 | Ogura | |
| 6,251,754 B1 * | 6/2001 | Ohshima et al. | 438/506 |
| 6,306,730 B2 | 10/2001 | Mitani et al. | |
| 6,368,938 B1 * | 4/2002 | Usenko | 438/407 |
| 6,423,614 B1 * | 7/2002 | Doyle | 438/458 |
| 6,613,678 B1 * | 9/2003 | Sakaguchi et al. | 438/695 |
| 6,661,065 B2 * | 12/2003 | Kunikiyo | 257/411 |
| 6,770,507 B2 | 8/2004 | Abe et al. | |
| 7,018,484 B1 * | 3/2006 | Atanackovic | 148/33.3 |

(Continued)

FOREIGN PATENT DOCUMENTS

JP 04-115511 A 4/1992

(Continued)

OTHER PUBLICATIONS

Quirk M. Semiconductor Manufacturing Technology, Prentice Hall, 2001, pp. 500-501.*

(Continued)

*Primary Examiner*—W. David Coleman
*Assistant Examiner*—Latanya Crawford
(74) *Attorney, Agent, or Firm*—Ladas & Parry LLP

(57) ABSTRACT

A process for manufacturing a silicon on insulator (SOI) substrate is described. The process includes forming a buried oxidation layer in a first wafer and forming an oxidation layer on the first wafer. A buried hydrogen layer is formed in the first wafer deeper than the buried oxidation layer. A second wafer is bonded onto the first oxidation layer. The first wafer is removed below the buried hydrogen layer to expose the first wafer between the buried oxidation layer and the buried hydrogen layer. The exposed first wafer and the buried oxidation layer are sequentially removed to expose the first wafer between the buried oxidation layer and the first oxidation layer. Finally, a predetermined thickness of the first wafer exposed in the previous step is removed. Accordingly, a highly uniform and ultra thin SOI substrate is formed without employing a CMP process.

10 Claims, 3 Drawing Sheets

U.S. PATENT DOCUMENTS

| | | | |
|---|---|---|---|
| 7,084,046 B2 * | 8/2006 | Mitani et al. | 438/459 |
| 7,217,584 B2 * | 5/2007 | Yue et al. | 438/31 |
| 7,217,636 B1 * | 5/2007 | Atanackovic | 438/455 |
| 7,276,430 B2 * | 10/2007 | Kwon | 438/459 |
| 7,387,946 B2 * | 6/2008 | Dao | 438/458 |
| 2002/0182827 A1 * | 12/2002 | Abe et al. | 438/455 |
| 2003/0207545 A1 * | 11/2003 | Yasukawa | 438/459 |
| 2005/0029592 A1 * | 2/2005 | Campbell et al. | 257/347 |
| 2005/0042841 A1 * | 2/2005 | Boyd et al. | 438/458 |
| 2005/0048703 A1 * | 3/2005 | Dennard et al. | 438/149 |
| 2005/0282318 A1 * | 12/2005 | Dao | 438/151 |
| 2006/0068565 A1 * | 3/2006 | Droes et al. | 438/458 |
| 2006/0128075 A1 * | 6/2006 | Kwon | 438/149 |
| 2006/0141786 A1 * | 6/2006 | Boezen et al. | 438/689 |
| 2006/0160327 A1 * | 7/2006 | Barna | 438/455 |
| 2006/0228492 A1 * | 10/2006 | Aoki et al. | 427/523 |
| 2007/0004169 A1 * | 1/2007 | Endo et al. | 438/433 |
| 2007/0069335 A1 * | 3/2007 | Endo et al. | 257/618 |

FOREIGN PATENT DOCUMENTS

| | | |
|---|---|---|
| JP | 07-263538 A | 10/1995 |
| JP | 11-121377 A | 4/1999 |
| KR | 1020020002998 A | 1/2002 |

OTHER PUBLICATIONS

'Dose-energy match for the formation of high-integrity buried oxide layers in low-dose separation-by-implantation-of-oxygen materials' Chen et al., Applied Physics Letters, vol. 80, No. 5, Feb. 4, 2002, pp. 880-882.

'Formation of Si islands in the buried oxide layers of ultra-thin SIMOX structures implanted at 65 keV' Jiao et al., Materials Science and Engineering B72 (2000) 150-155.

* cited by examiner

FIG. 1D
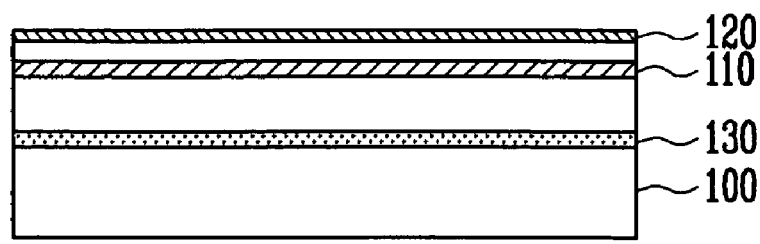
FIG. 1E
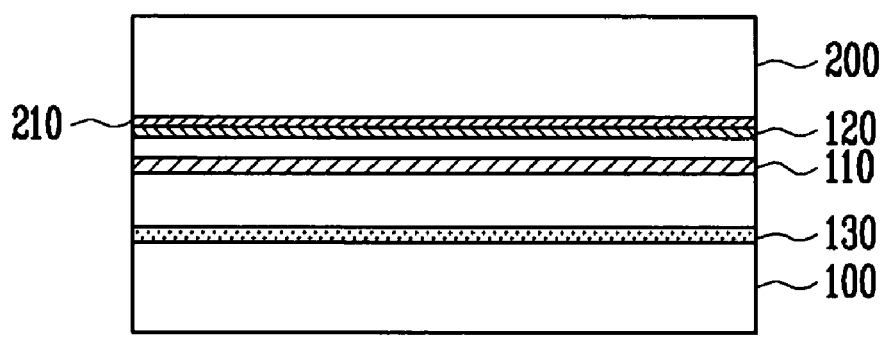
FIG. 1F
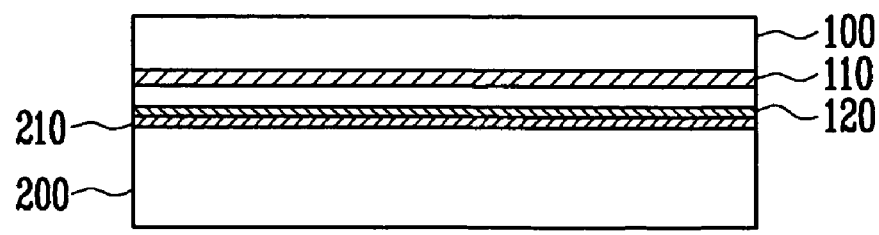

MANUFACTURING METHOD OF SILICON ON INSULATOR WAFER

CROSS-REFERENCE TO RELATED APPLICATION

This application claims priority to and the benefit of Korean Patent Application No. 2004-105774, filed Dec. 14, 2004, and No. 2005-038732, filed May 10, 2005, the disclosure of which is incorporated herein by reference in its entirety.

BACKGROUND

1. Field of the Invention

The present invention relates to a method of manufacturing a silicon on insulator (hereinafter, referred to as SOI) which is essential for implementing a semiconductor integrated circuit having ultra large scale integration, very high speed, and low power consumption characteristics, and more particularly, to a method of manufacturing an ultra thin SOI substrate having a uniform thickness and an interface characteristic of high quality which are essential in manufacture of an nano-class semiconductor device.

2. Discussion of Related Art

In general, an SOI substrate has been developed as a substrate of a next-generation electronic device which is capable of overcoming problems such as unstable insulation between devices and occurrence of parasitic capacitance of the conventional silicon substrate when a large mount of electronic devices are integrated.

A structure of the SOI substrate means that an insulating layer is formed on a silicon wafer and a single crystalline silicon layer is present thereon. In a broad sense, the structure of the SOI substrate means that a silicon single crystal is formed on top of the SOI substrate regardless of kinds of a lower substrate and an insulating layer.

A technique of manufacturing such an SOI substrate has been progressed with a research of silicon on sapphire (SOS) in 1960s, and zone-melting and recrystallization (ZMR) method, a porous silicon oxidation method, a lateral epitaxial growth method of silicon, and so forth have been researched in its initial development. However, a separation by implantation of oxygen (SIMOX) technique, a unibond technique using smart cut, an epitaxial layer transfer technique or the like have been a main stream in recent years.

According to the SIMOX technique of the related art, oxygen of about $1 \times 10^{17}$ to $9 \times 10^{17}$ atoms/cm$^2$ is injected into the silicon, which is then subjected to annealing and oxidation at a high temperature of about 1300° C. to 1500° C. for recrystallization of the silicon and stability of the buried oxidation layer and defect removal.

However, according to the SIMOX technique of the related art, it is difficult to form a silicon layer having a uniform thickness and a low concentration of impurity, and a high defect density at an interface and a region near the interface, and poor surface roughness can adversely affect an device.

In addition, according to the UNIBOND technique of the related art, a smart cut method is employed by which hydrogen ions are first injected into a silicon wafer in which an insulating layer is already formed, which is then bonded with another silicon wafer to make a lower part of the hydrogen ion injection location of the silicon wafer fall off through a subsequent annealing process to thereby form a thin silicon layer, so that effects such as higher crystal quality, higher BOX quality, less surface roughness and low price process in thick film SOI can be expected as compared to other methods of the related art, however, thickness uniformity is still required, and productivity is degraded due to several processes such as a chemical mechanical polishing (CMP) process.

In addition, according to the ELTRAN technique of the related art, a porous silicon layer is first formed on a silicon wafer, and a single crystalline silicon-epitaxial-layer is formed on the resultant structure using an epitaxial process. Thereafter, the resultant structure is bonded with the silicon wafer where an insulating layer is formed, and the whole silicon wafer of the wafer where a single crystal is formed and the porous silicon layer are removed by polishing and etching processes to thereby obtain a planarized silicon layer. The technique is relatively advantageous in control of a thickness of the silicon layer, however, it is not good for matching with a complementary metal oxide semiconductor (CMOS) process of the related art, and is limited to some applications due to degradation of film quality, particle occurrence, poor surface roughness, degraded reliability, or the like.

As described above, the conventional techniques (SIMOX, UNIBOND, and ELTRAN or the like) for manufacturing an ultra thin body (UTB) SOI substrate used in manufacture of the UTB SOI CMOS device, do not completely meet requirements of the UTB SOI wafer which requires control on a uniform thickness, a low defect density, and an upper silicon thickness of several nanometers in nano-class devices.

SUMMARY OF THE INVENTION

The present invention is directed to a method of manufacturing an UTB SOI substrate having a uniform thickness characteristic and an interface characteristic of high quality which are essential for manufacturing a nano-class semiconductor device.

One aspect of the present invention is to provide a method of manufacturing an SOI substrate, which includes: the steps of: (a) forming a buried oxidation layer to a predetermined depth of a first wafer and forming an oxidation layer on the first wafer; (b) forming a buried hydrogen layer in the first wafer to a depth larger than the buried oxidation layer; (c) bonding a second wafer onto the first oxidation layer; (d) removing the first wafer below the buried hydrogen layer so as to expose the first wafer between the buried oxidation layer and the buried hydrogen layer; (e) sequentially removing the exposed first wafer and the buried oxidation layer so as to expose the first wafer between the buried oxidation layer and the first oxidation layer; and (f) removing a predetermined thickness of the first wafer exposed in the step of sequentially removing the exposed first wafer.

In this case, the step of forming the buried oxidation layer preferably includes: the steps of (a-1) injecting oxygen ions to into a surface of the first wafer to form the buried oxidation layer to a predetermined depth of the first wafer; and (a-2) carrying out annealing and oxidation processes to form the oxidation layer on the first wafer so as to make uniform an interface of the buried oxidation layer and remove defects of its rough surface.

Preferably, the oxygen ions having about 1 to $5 \times 10^{17\text{-}18}$ atoms/cm$^2$ are injected in an energy range of about 30 to 200KeV.

Preferably, the annealing process is carried out in a temperature range of about 1300° C. to 1500° C.

Preferably, the buried hydrogen layer is formed to be deeper than the buried oxidation layer by 10 to 1000 nm when forming the buried hydrogen layer.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIGS. 1A to 1H are cross-sectional views for explaining a method of manufacturing an SOI substrate in accordance with an embodiment of the present invention.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout the specification.

FIGS. 1A to 1H are cross-sectional views for explaining a method of manufacturing an SOI substrate in accordance with an embodiment of the present invention.

Figure 1A:
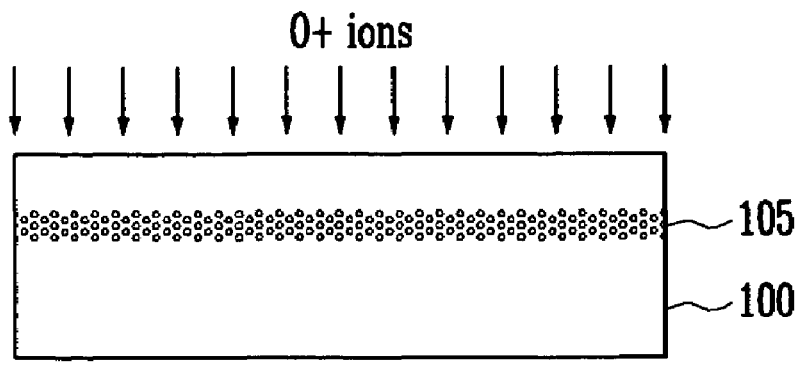

Referring to FIG. 1A, a predetermined amount of oxygen ion 105 is injected into a surface of a first silicon wafer 100 used as a control wafer.

In this case, the oxygen ions 105 with a dose of about 1 to $5 \times 10^{17-18}$ atoms/cm$^2$ are preferably injected in an energy range of about 30 to 200KeV.

Figure 1B:
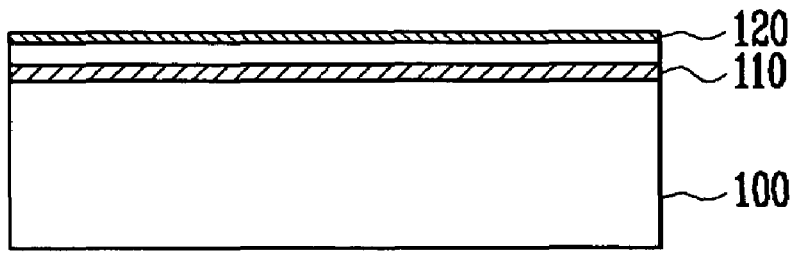

Referring to FIG. 1B, silicon is recrystallized and defects are removed while annealing and oxidation processes are carried out so as to form a buried oxidation layer 110 to a predetermined depth. In this case, the buried oxidation layer 110 is formed to a predetermined depth of the first silicon wafer 100 by the injection energy (105), and a first oxidation layer 120 is formed by oxidation of intermediate first silicon on a surface of the buried oxidation layer 110 in a thickness range of about 20 to 200 nm.

Accordingly, an interface of the buried oxidation layer 110 becomes uniform and defects of its rough surface are removed. That is, when an annealing process is additionally carried out in the oxidation atmosphere, the surface defects are concentrated to the surface of the buried oxidation layer 110 so that the interface state and the film quality can be significantly improved. Such an oxidation process may be skipped, and may be positively utilized as a method capable of reducing defects, improving the interface roughness, and making thin the thickness of the first silicon wafer 100 on buried oxide 110 if necessary.

In addition, the thickness of the intermediate first silicon wafer 100 primarily becomes thinner by means of the formation of the first oxidation layer 120.

In the meantime, the annealing process is preferably carried out in a temperature range of about 1300° C., to 1500° C.

Figure 1C:
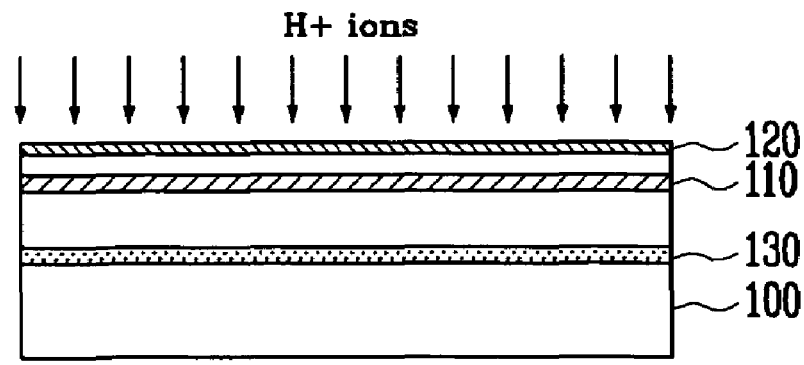

Referring to FIG. 1C, a predetermined amount of hydrogen ion is injected into the first silicon wafer 100 so as to be deeper than the buried oxidation layer 110, thereby forming a buried hydrogen layer 130 having a predetermined thickness.

In this case, the buried hydrogen layer 130 is preferably formed so as to be deeper than the buried oxidation layer 110 by about 10 to 1000 nm.

Alternatively, the buried hydrogen layer 130 may be formed inside the buried oxidation layer 110 or at an interface surface between the buried oxidation layer 110 and its lower first silicon wafer 100.

Referring to FIG. 1D, a second silicon wafer 200 used as a handle wafer is prepared. In this case, a second oxidation layer 210 having a thickness range of about 5 to 10000 nm is preferably formed on a surface of the second silicon wafer 200.

Referring to FIG. 1E, the first oxidation layer 120 of the first silicon wafer 100 and the second oxidation layer 210 of the second silicon wafer 200 are bonded to each other by a typical wafer bonding method (e.g. a hydrogen bonding method).

Referring to FIG. 1F, the first silicon wafer 100 below the buried hydrogen layer 130 is removed so as to expose the first silicon wafer 100 between the buried oxidation layer 110 and the buried hydrogen layer 130.

In this case, a smart cut method is carried out on the first silicon wafer 100 below the buried hydrogen layer 130 in a nitrogen or oxygen atmosphere at a temperature of about 300° C. to 600° C., so that unbonded hydrogens (H) present in the buried hydrogen layer 130 expand to destroy the buried hydrogen layer 130, thereby separating the first silicon wafer 100 below the buried hydrogen layer 130.

Since the surface of the first silicon wafer 100 cut by the smart cut method is very rough and has a large mount of defects inside, it is preferable to etch the surface, for example, using a silicon strip solution, or etc.

Figure 1G:
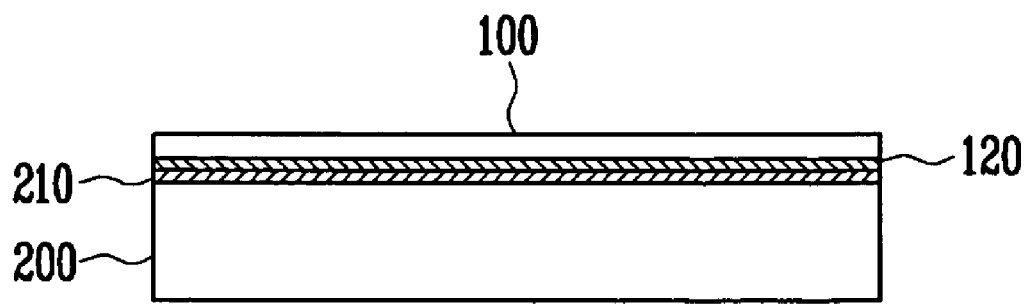

Referring to FIG. 1G, the exposed first silicon wafer 100 and the buried oxidation layer 110 are sequentially removed to expose the first silicon wafer 100 between the buried oxidation layer 110 and the first oxidation layer 120.

In this case, the exposed first silicon wafer 100 is preferably removed by a wet or dry etching method, and the buried oxidation layer 110 is preferably removed, for example, by a wet etching method.

Figure 1H:
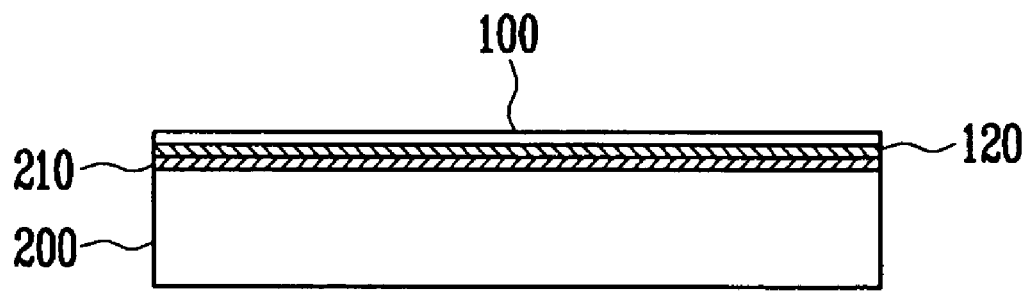

Referring to FIG. 1H, a predetermined thickness of the first silicon wafer 100 exposed between the buried oxidation layer 110 and the first oxidation layer 120 is removed.

In this case, the first silicon wafer 100 exposed between the buried oxidation layer 110 and the first oxidation layer 120 is preferably removed using at least one method of an oxidation/etching method, a CMP method, and a hydrogen annealing method in order to reduce its surface defects and thin and smooth its thickness and surface roughness.

In the meantime, metal impurities may be injected during the process of FIGS. 1A and 1B, so that the first oxidation layer 120 may be removed and a silicon epitaxial layer of high quality in which low concentration impurities are injected at a low temperature may be subsequently deposited after the process of FIG. 1B is carried out in order to reduce effects of the injected metal impurities, thereby manufacturing a silicon thin film having high quality and high purity.

In addition, after the process of FIG. 1B is carried out, the upper first oxidation layer 120 may be removed and a SiGe buffer layer, a SiGe relaxation layer, and a strained silicon layer may be deposited to manufacture a UTB SOI substrate having a strained silicon layer.

According to the method of manufacturing the SOI substrate of the present invention as described above, a UTB SOI substrate can be advantageously provided which has a uniform thickness characteristic and an interface characteristic of high quality which are essential for manufacturing a nano-class semiconductor device.

In addition, according to the present invention, an existing technique can be utilized, and does not require a CMP process accompanying a high cost, so that the process can be relatively simple and readily carried out.

In addition, according to the present invention, it can contribute to manufacture of a nano-class semiconductor device, a research on the next generation new device, manufacture of an ultra high performance circuit, and system design, and can contribute to advancement of practical use of products applied with the same.

Although the present invention has been described with reference to certain exemplary embodiments of the method of manufacturing the SOI substrate, it will be understood by those skilled in the art that a variety of modifications and variations may be made to the present invention without departing from the spirit or scope of the present invention defined in the appended claims, and their equivalents.

What is claimed is:

1. A method of manufacturing a silicon on insulator (SOI) substrate, comprising the steps of:
    forming a buried oxidation layer to a predetermined depth of a first wafer and forming a first oxidation layer on the first wafer such that a portion of the first wafer remains between the buried oxidation layer and the first oxidation layer;
    carrying out annealing and oxidation processes to form the first oxidation layer on the first wafer so as to make uniform an interface of the buried oxidation layer and remove defects of its rough surface;
    forming a buried hydrogenated layer in the first wafer to a depth deeper than the buried oxidation layer such that a portion of the first wafer remains between the buried oxidation layer and the buried hydrogenated layer;
    bonding a second oxidation layer of a second wafer onto the first oxidation layer of the first wafer;
    removing a portion of the first wafer below the buried hydrogenated layer and the buried oxidation layer so as to expose the portion of the first wafer between the buried oxidation layer and the buried hydrogenated layer;
    sequentially removing the exposed first wafer and the buried oxidation layer so as to expose the portion of the first wafer between the buried oxidation layer and the first oxidation layer; and
    removing a planar portion of a predetermined thickness of the first wafer exposed in the step of sequentially removing the exposed first wafer.

2. The method according to claim 1, the step of forming the buried oxidation layer further comprises the step of:
    injecting oxygen ions to into a surface of the first wafer to form the buried oxidation layer to a predetermined depth of the first wafer.

3. The method according to claim 1, wherein the annealing process is carried out in a temperature range of about 1300° C. to 1500° C.

4. The method according to claim 1, wherein the buried hydrogenated layer is formed to be deeper than the buried oxidation layer by 10 to 1000 nm when forming the buried hydrogenated layer.

5. The method according to claim 1 the step of bonding the second wafer onto the first oxidation layer further comprises the step of forming the second oxidation layer having a thickness range of 5 to 1000 nm on the second wafer bonded with the first wafer.

6. The method according to claim 1, wherein, in the step of removing the first wafer below the buried hydrogenated layer, the first wafer below the buried hydrogenated layer is removed using a smart cut method of carrying out an annealing process in a nitrogen or oxygen atmosphere at a temperature of 300° C. to 600° C.

7. The method according to claim 1, wherein, in the step of sequentially removing the exposed first wafer and the buried oxidation layer, the first wafer exposed when removing the first wafer is removed by a wet or dry etching method.

8. The method according to claim 1, wherein, in the step of sequentially removing the exposed first wafer and the buried oxidation layer, the buried oxidation layer is removed by a wet etching method.

9. The method according to claim 1, wherein, in the step of removing a predetermined thickness of the first wafer, the first silicon wafer exposed when sequentially removing the exposed first wafer and the buried oxidation layer is removed using at least one method of an oxidation/etching method, a chemical mechanical polishing (CMP) method, and a hydrogen annealing method so as to reduce its surface defects and make its thickness thin.

10. The method according to claim 2, wherein the oxygen ions having about 1 to $5\times10^{17-18}$ atoms/cm$^2$ are injected in an energy range of about 30 to 200KeV.

* * * * *